Nov. 11, 1969 H. HENKER 3,477,885

METHOD FOR PRODUCING A STRUCTURE COMPOSED OF MUTUALLY INSULATED SEMICONDUCTOR REGIONS FOR INTEGRATED CIRCUITS

Filed March 18, 1966

United States Patent Office 3,477,885

Patented Nov. 11, 1969

3,477,885

METHOD FOR PRODUCING A STRUCTURE COMPOSED OF MUTUALLY INSULATED SEMICONDUCTOR REGIONS FOR INTEGRATED CIRCUITS

Heinz Henker, Munich, Germany, assignor to Siemens Aktiengesellschaft, Erlangen, Germany, a corporation of Germany Filed Mar. 18, 1966, Ser. No. 535,588
Claims priority, application Germany, Mar. 26, 1965, S 96,207
Int. Cl. H01l *1/18*
U.S. Cl. 148—174 16 Claims

ABSTRACT OF THE DISCLOSURE

Method of producing a structure composed of mutually insulated semiconductor regions for integrated circuits, which comprises placing a plurality of semiconductor bodies besides one another in face-to-face contact upon a heat-resistant support, said bodies having an insulating coating at least on the entire surface not contacting the support; then depositing a crystalline material upon the semiconductor bodies and the support while preserving said insulating coating and thereby completely embedding said semiconductor bodies and bonding them together to a single integral structure; and thereafter separating said structure from said support.

Figures 1, 2:
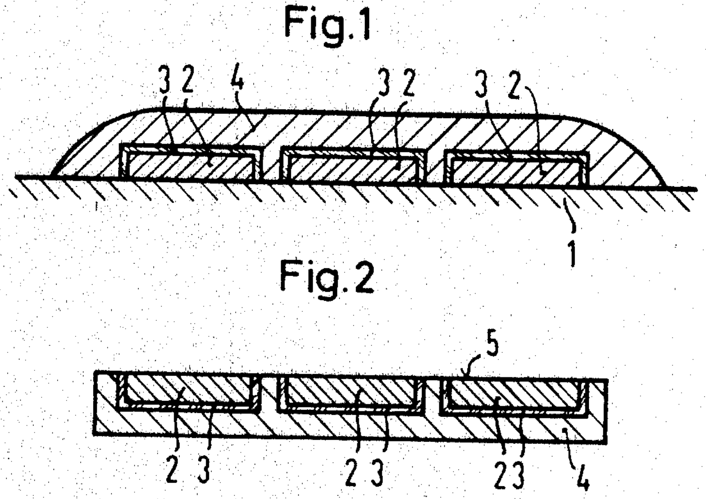

My invention relates to a method for producing semiconductor structures composed of mutually insulated semiconductor regions for integrated circuits.

The photo-varnish and planar techniques afford simultaneously producing several circuit components, such as transistors, diodes, resistors and capacitors, within a single piece of monocrystalline silicon. If these components are to be electrically interconnected to form an integrated circuit, their mutual insulation poses a severe problem, as it requires producing within a single silicon crystal a number of monocrystalline regions which are electrically separated from each other. There are several possibilities of such mutual insulation:

(a) "Insulating p-n junctions" produced in a monocrystallinet semiconductor wafer, for example of silicon, by such known methods as diffusion or epitaxy;

(b) "dielectrical intermediate layers" produced, for example, by the "Epic process" described in Electronics of June 1, 1964, page 23.

It is an object of my invention to considerably reduce the quantity of monocrystalline semiconductor material required for producing a structure having mutually insulated semiconductor regions on a preferably planar surface portion, for the purpose of providing the structure with active circuit components or integrated circuits of such components.

Another object of the invention is to attain a considerably greater liberty with respect to the diversity in applicable designs and shapes of such integrated circuit devices.

According to my invention, I place at least two semiconductor bodies beside one another upon a heat-resistant, preferably planar support, the semiconductor bodies being in face-to-face contact with the support. Thereafter the surface of the semiconductor bodies that are not in contact with the support and are completely covered by an insulating coating, are provided with a deposition of crystalline, preferably semiconducting material on top of the insulating coatings and in such a manner that the semiconductor bodies placed on the support are joined together so as to form a single integral, solid structure. Ultimately, this coherent and integral structure is separated from the support.

For further explaining the invention, reference will be had to the accompanying drawing, in which FIG. 1 shows an assembly of components in cross section at an intermediate stage of the method, and FIG. 2 shows a completed structure made according to the invention, also in cross section.

Referring to FIG. 1, the method is carried out by providing a planar support 1 of heat-resistant material 1 which, during performance of the process, does not issue appreciable quantities of impurities. A suitable material, for example, is silicon dioxide ($SiO_2$) of graphite. Circular semiconductor wafers 2 are placed upon the planar top of the support in face-to-face contact therewith. All other surface areas of the circular wafers 2, or if desired also the flat surface resting upon the planar support 1, are coated with a layer of $SiO_2$. This assembly is subjected to precipitation of polycrystalline silicon which forms a semiconductor layer 4. The precipitation process is continued until all of the wafers 2 and the precipitated silicon form conjointly a single body in the shape of a plate or disc.

Thereafter, the entire disc is separated from the support 1 and, if desired, subjected to peripheral grinding, thus resulting in the structure shown in FIG. 2.

After removal the composite structure from the support 1, this structure is further fabricated in known manner to form a complete semiconductor device or integrated circuit. Such further fabrication comprises a surface treatment, for example lapping and polishing, by means of which the body is given a uniform disc-shaped configuration.

It is of advantage in comparison with the Epic process, that after the growth of the usually polycrystalline material of layer 4, the resulting integral structure already comprises mutually insulated regions whose surface 5 may serve as a reference for any further machining or other fabrication. A very slight elimination of material at the surface 5 suffices to prepare it for such further processing.

The method according to the invention can be carried out with semiconductor bodies 2 which, prior to placing them onto the support, have locally different conductivities. Thus, the bodies 2 may already be provided with p-n junctions before combining them with each other by precipitation of the semiconductor layer 4. In cases where such p-n junctions are not yet present in the semiconductor bodies, these junctions can be produced in the corresponding regions of the integral structure according to FIG. 2 by applying the conventional methods and, if desired, with the aid of the known masking techniques. The p-n junctions, if produced prior to deposition of the layer 4, are preferably so designed that they will reach the intended ultimate position or constitution only on account of the heat developed by the method according to the invention. This is readily possible because of the relatively short amount of time required for polycrystalline precipitation of the layer 4.

Prior to such processes, the surface area 5 of the integral structure is preferably cleaned, at least partially, of any silicon dioxide present. (As a rule, it is advantageous to provide for such an $SiO_2$ coating also on the flat sides of the semiconductor bodies 2 facing the support 1.) Cleaning and etching in the conventional manner suffices to prepare the surface 5 of the structure for further fabricating operations.

There are several possibilities of further fabricating the composite semiconductor structure produced according to the invention. One way is to clean the surface 5 by polishing and etching so as to fully remove any oxide and other foreign substances, in order to subsequently employ one or more processes conventionally used with semiconductor components, for example oxidation, photovarnish techniques, diffusion processes, or others. Another way is to coat the surface 5 for masking purposes, passivation or insulation with a layer of oxide or other insulating material.

Aside from the fabricating steps mentioned in the foregoing, the surface 5 may be subsequently coated with a new layer of $SiO_2$ for protection of the p-n junctions from external influences and also to serve as a carrier of contact means in form of electrically conducting paths for interconnecting the electrical components combined within the integrated circuit structure.

For high mechanical strength of the composite structure, the individual semiconductor wafers 2, as a rule, are made of the same material as that employed for the embedding layer 4. On the other hand, it is a considerable advantage of the method according to the invention that it also permits using semiconductor bodies having not only respectively different crystalline structures but also consisting of respectively different materials. Thus, aside from the above-mentioned semiconductor bodies, other components, such as complete electrical circuit components, having a suitable thermal and chemical resistivity, may be built into the composite and integrally bonded structure to be produced. Even metals having a suitable coefficient of expansion, or insulating parts may be bonded into the integral body, for example parts of ceramic material such as sintered alumina, whose thermal coefficient of expansion substantially corresponds to that of the embedding material.

Preferably the material of the embedding layer 4, for example polycrystalline silicon, is directly precipitated upon the semiconductor crystals 2 and the support 1 from a reaction gas. Applicable for this purpose, for example, is silicochloriform ($SiHCl_3$) or silicon tetrachloride ($SiCl_4$). The reaction gas is preferably mixed with hydrogen to act as a diluent or reactive component. In this case, it is advisable to employ the support 1 as a heat source for the precipitation process in the manner generally known from semiconductor epitaxial processes. This is done, for example, by having the support 1 consist at least partially of conducting material such as graphite, and heating the support to the required reaction temperature by an electric current flowing through the support. The surface of such a support is preferably covered by a protective coating of $SiO_2$ of SiC which can be produced with high purity from the gaseous phase. When employing such or similar supports, it is particularly easy to mechanically separate the bonded structure produced from the support if the thermal coefficients of expansion are appreciably different from each other. When using other, cheaper supports, for example of sintered MgO or $SiO_2$, it may be necessary to provide for chemical separation by an agent acting as a solvent for the material of the support. In the latter case the separation is effected by etching the support away from the structure produced.

To reliably afford a reproducible arrangement of the semiconductor bodies to be bonded together into the integral structure, the support 1 may be provided with corresponding markings or with a suitable profile, such as bosses or recesses, which determine the proper position of the semiconductor wafers 2. In this manner, the arrangement of the semiconductor wafers is geometrically predetermined by the matrices formed by the recesses or bosses; but care must be taken that these matrices, if they are not removed during precipitation of the embedding material 4, do not interfere with the deposition of the embedding material.

To those skilled in the art, it will be apparent from the present disclosure that with respect to specific materials, geometric shapes or number of components employed in the process, my invention permits of a great variety of modifications and may be given embodiments other than particularly illustrated and described herein, without departing from the essential features of my invention.

I claim:

1. The method of producing a structure composed of mutually insulated semiconductor regions for integrated circuits, which comprises placing a plurality of semiconductor bodies beside one another in face-to-face contact upon a heat-resistant support at least one of said bodies being of a different semiconductor element or a different semiconductor compound than the remaining bodies, said bodies having an insulating coating at least on the entire surface not contactig the support; the depositig a crystalline material upon the semiconductor bodies and the support while preserving said insulating coating and thereby completely embedding said semiconductor bodies and bonding them together to a single integral structure; and thereafter separating said structure from said support.

2. The method according to claim 1, wherein the top surface of the heat-resistant support is planar, and the semiconductor bodies are formed of wafers placed flat upon said planar surface in mutually spaced relation.

3. The method according to claim 1, wherein the crystalline material is a semiconductor substance which is insulated by said coatings from the semiconductor material of said bodies.

4. The method according to claim 1, wherein said support is formed with integral guide means which define localities onto which said semiconductor bodies are placed.

5. The method according to claim 1, wherein said crystalline material consists of the same semiconductor material as said bodies and is deposited in the polycrystalline state.

6. The method according to claim 1, wherein said insulating coating is formed of an oxide.

7. The method according to claim 1, wherein said coating on said bodies is formed of silicon dioxide.

8. The method according to claim 1, wherein the separation of the resulting structure from said support is effected mechanically.

9. The method according to claim 1, wherein the separation of the resulting structure from said support is effected chemically by etching the support away from said structure.

10. The method according to claim 1, which comprises depositing said crystalline material by precipitation from the gaseous phase.

11. The method according to claim 10, which comprises heating said support during precipitation of the crystalline material.

12. The method according to claim 1, which comprises placing further bodies of other than semiconductor material upon said carrier beside said semiconductor bodies, and depositing said crystalline material also upon said further bodies so as to also embed them in said integral structure.

13. The method according to claim 1, wherein at least one of said semiconductor bodies is provided with a p-n junction prior to placing it upon said support for embedment in said crystalline material.

14. The method according to claim 1, which comprises forming a p–n junction in at least one of said semiconductor bodies after embedment in said integral structure.

15. The method according to claim 1, which comprises coating the separated integral structure at the separation face with an insulating oxide layer.

16. The method according to claim 1, wherein at least one of said semiconductor bodies has locally different specific electric resistances.

References Cited

UNITED STATES PATENTS

| | | | |
|---|---|---|---|
| 3,332,137 | 7/1967 | Kenny | 29—578 XR |
| 3,343,255 | 9/1967 | Donovan | 148—175 XR |
| 3,381,182 | 4/1968 | Thornton | 317—234 |

L. DEWAYNE RUTLEDGE, Primary Examiner

P. WEINSTEIN, Assistant Examiner

U.S. Cl. X.R.

317—101, 234, 235; 148—1.5, 125; 117—106, 201, 212; 29—577, 578, 580